(12) United States Patent
Uneme et al.

(10) Patent No.: US 10,225,962 B2
(45) Date of Patent: Mar. 5, 2019

(54) POWER CONVERTER

(71) Applicant: Honda Motor Co., Ltd., Tokyo (JP)

(72) Inventors: Takahiro Uneme, Saitama (JP);
Takahiro Hagimoto, Saitama (JP);
Hiroo Yamaguchi, Saitama (JP);
Shinichi Yataka, Saitama (JP); Yuko Yamada, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 15/672,302

(22) Filed: Aug. 9, 2017

(65) Prior Publication Data
US 2018/0064000 A1    Mar. 1, 2018

(30) Foreign Application Priority Data

Aug. 29, 2016  (JP) .................................. 2016-167140

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC .............. H01L 23/473; H05K 7/20772; H05K 7/20781; H05K 7/20927; H05K 7/2079; H05K 7/20272; H05K 7/20836; H05K 7/20254; H05K 7/20509; H05K 7/20; H05K 7/20763; H05K 7/2039; H05K 7/20218
See application file for complete search history.

(56) References Cited

U.S. PATENT DOCUMENTS

| | | | | |
|---|---|---|---|---|
| 7,835,151 | B2* | 11/2010 | Olesen ................. | H01L 23/473 165/121 |
| 7,940,526 | B2* | 5/2011 | Schulz-Harder ...... | H01L 23/473 165/104.33 |
| 8,363,403 | B2* | 1/2013 | Tonomoto ........... | H01L 23/4334 165/80.2 |
| 9,502,331 | B2* | 11/2016 | Sano ..................... | H01L 23/473 |
| 9,627,294 | B2* | 4/2017 | Kakiuchi .............. | H01L 23/473 |
| 10,070,565 | B2* | 9/2018 | Mizuno ............. | H05K 7/20927 |

(Continued)

FOREIGN PATENT DOCUMENTS

JP          4089595          5/2008

*Primary Examiner* — Adam B Dravininkas
(74) *Attorney, Agent, or Firm* — JCIPRNET (57) ABSTRACT

A power converter includes: a refrigerant flow channel member in which a refrigerant cooling an electronic device flows; a flat refrigerant pipe portion stacked with a power module, provided for a refrigerant cooling the power module to flow therein, and including a contact surface portion contacting the power module to exchange heat; an inlet pipe portion that is disposed at one end of the refrigerant pipe portion and through which the refrigerant flows to the refrigerant pipe portion; an outlet pipe portion that is disposed at the other end of the refrigerant pipe portion and through which the refrigerant flows from the refrigerant pipe portion; an inlet connection portion connecting the inlet pipe portion to the refrigerant flow channel member and formed of a tubular elastic member; and an outlet connection portion connecting the outlet pipe portion to the refrigerant flow channel member and formed of a tubular elastic member.

20 Claims, 7 Drawing Sheets

(56) References Cited

U.S. PATENT DOCUMENTS

| | | | |
|---|---|---|---|
| 2004/0144996 A1* | 7/2004 | Inoue | H01L 23/4006 257/200 |
| 2005/0121173 A1* | 6/2005 | Inagaki | F28D 1/0325 165/80.3 |
| 2005/0194034 A1* | 9/2005 | Yamaguchi | H01L 35/30 136/205 |
| 2006/0219396 A1* | 10/2006 | Abei | F28D 1/0333 165/164 |
| 2008/0239663 A1* | 10/2008 | Yamamoto | H01L 23/473 361/691 |
| 2009/0284921 A1* | 11/2009 | Colgan | H01L 23/473 361/699 |
| 2011/0317366 A1* | 12/2011 | Fukutani | H01L 25/072 361/699 |
| 2013/0058068 A1* | 3/2013 | Funatsu | H05K 7/20927 361/820 |
| 2013/0335918 A1* | 12/2013 | Tachibana | H05K 5/0213 361/689 |
| 2014/0001630 A1* | 1/2014 | Takamura | H01L 23/433 257/719 |
| 2014/0098496 A1* | 4/2014 | Nakasaka | H01L 23/473 361/699 |
| 2015/0109729 A1* | 4/2015 | Campbell | H05K 7/203 361/679.47 |
| 2015/0189790 A1* | 7/2015 | Tachibana | H05K 7/20254 361/699 |
| 2016/0079145 A1* | 3/2016 | Nakagawa | H01L 23/4012 361/699 |

* cited by examiner

POWER CONVERTER

CROSS-REFERENCE TO RELATED APPLICATION

This application claims the priority benefit of Japan application serial no. 2016-167140, filed on Aug. 29, 2016. The entirety of the above-mentioned patent application is hereby incorporated by reference herein and made a part of this specification.

BACKGROUND OF THE INVENTION

Field of the Invention

The present invention relates to a power converter which is applied to a vehicle or the like.

Description of Related Art

An electric vehicle or the like is equipped with a double-side cooling power converter with a small size and high performance. Such a type of power converter requires high cooling efficiency. Accordingly, various techniques for enhancing cooling efficiency of a power converter have been proposed.

A power converter having a configuration in which a plurality of double-side cooling power modules constituting a power conversion circuit are interposed between a plurality of double-flat cooling pipe portions arranged in parallel has been proposed (for example, see Patent Document 1).

In the power converter described in Patent Document 1, an assembly with a stacked structure in which a double-side cooling power module is interposed between a plurality of double-flat cooling pipe portions having a structure in which a refrigerant flows is constituted. The assembly is provided with an inlet-side header portion that supplies a refrigerant to each double-flat cooling pipe portion and an outlet-side header portion that corresponds to the inlet-side header portion. Such header portions include a contractible portion that contracts by compression using a long bolt or the like for fastening the assembly with the stacked structure in the stacking direction thereof. By allowing the contractible portion to contract due to compression, unevenness in dimensions or the like of the constituent portions is considered to be absorbed.

PRIOR ART DOCUMENT

Patent Documents

[Patent Document 1] Japanese Patent No. 4089595

SUMMARY OF THE INVENTION

Problem to be Solved

However, in the technique described in Japanese Patent No. 4089595, a degree of absorption of unevenness in dimensions of constituent parts is relatively low. Since a connection portion includes the contractible portion, there is concern that a stress may be applied to a brazed part and water leakage may occur. There is concern that the contractible portion may not absorb vibration and fatigue fracture may occur due to vibration when the thickness of the cooling pipes is decreased to achieve a decrease in weight or an increase in cooling performance.

The invention is made in consideration of the above-mentioned circumstances and an object thereof is to provide a power converter that has a sufficient degree of absorption of unevenness in dimensions of constituent portions and the like, has high vibration absorption performance, and can prevent fatigue fracture.

Solution to the Problem (1) A power converter including: an electronic device that includes a semiconductor chip or a semiconductor module (for example, a power module 3 to be described later) and constitutes a part of a predetermined power conversion circuit; a refrigerant flow channel member (for example, a refrigerant flow channel member 2 to be described later) in which a refrigerant for cooling the electronic device flows; a flat refrigerant pipe portion (for example, a refrigerant pipe portion 4 to be described later) that is alternately stacked along with the semiconductor chip or the semiconductor module, is provided for a refrigerant for cooling the semiconductor chip or the semiconductor module to flow therein, and includes a contact surface portion (for example, a contact surface portion 41 to be described later) which comes into contact with a principal surface of the semiconductor chip or the semiconductor module to exchange heat; an inlet pipe portion (for example, an inlet pipe portion 42 to be described later) that is disposed at one end of the refrigerant pipe portion and through which the refrigerant flows to the refrigerant pipe portion; an outlet pipe portion (for example, an outlet pipe portion 43 to be described later) that is disposed at the other end of the refrigerant pipe portion and through which the refrigerant flows from the refrigerant pipe portion; an inlet connection portion (for example, an inlet connection portion 51 to be described later) that connects the inlet pipe portion to the refrigerant flow channel member and is formed of a tubular elastic member; and an outlet connection portion (for example, an outlet connection portion 52 to be described later) that connects the outlet pipe portion to the refrigerant flow channel member and is formed of a tubular elastic member.

According to the power converter described in (1), since the inlet connection portion and the outlet connection portion which are formed as tubular elastic members are disposed in the inlet pipe portion and the outlet pipe portion, the tolerance of unevenness in dimensions or the like of the constituent portions increases. Since the inlet pipe portion and the outlet pipe portion are connected to the refrigerant flow channel member via the elastic members, vibration absorption performance is high.

Accordingly, it is possible to prevent fatigue fracture even when the thickness of the refrigerant pipe portion is small.

(2) The power converter according to (1), wherein a part of the inlet pipe portion on the refrigerant flow channel member side is inserted into the inlet connection portion, a part of the outlet pipe portion on the refrigerant flow channel member side is inserted into the outlet connection portion, and the power converter further includes a first fixing member (for example, a first fixing member 6 to be described later) that clamps the inlet connection portion in cooperation with the inlet pipe portion and clamps the outlet connection portion in cooperation with the outlet pipe portion.

According to the power converter described in (2), in the power converter according to (1), particularly, it is possible to prevent leakage of a refrigerant (water leakage) with a simple configuration.

(3) The power converter according to (2), wherein the first fixing member includes two members (for example, two members 6a and 6b to be described later) each having a fastening hole, and the two members are fastened and fixed to each other at the fastening holes by fastening members (for example, bolts 62 to be described later) such that the inlet pipe portion and the outlet pipe portion are interposed therebetween.

According to the power converter described in (3), in the power converter according to (2), particularly, it is possible to easily clamp the inlet pipe portion and the outlet pipe portion with a fastening force based on the fastening members such as bolts.

(4) The power converter according to (3), wherein a plurality of neighboring first fixing members of which each is the same as the first fixing member are integrally fastened and fixed by fastening members.

According to the power converter described in (4), it is possible to reduce the number of components or to reduce the number of assembling operation processes, for example, by integrally fixing the first fixing members with the fastening members such as bolts.

(5) The power converter according to any one of (1) to (4), wherein the refrigerant flow channel member includes holes (for example, holes 23 to be described later) formed on a surface (for example, a surface 2a to be described later) thereof, the inlet connection portion and the outlet connection portion include flange portions (for example, a flange portion 53 to be described later) disposed to cover the holes, and the power converter further includes a second fixing member (for example, a second fixing member 7 to be described later) that clamps the flange portion in cooperation with the surface of the refrigerant flow channel member.

According to the power converter described in (5), it is possible to prevent leakage of a refrigerant (water leakage) with a simple structure.

(6) The power converter according to any one of (1) to (5), wherein the inlet connection portion and the outlet connection portion include bellows portions (for example, bellows portions 51a and 52a to be described later) that is formed in a bellows shape.

According to the power converter described in (6), in the power converter according to any one of (1) to (5), particularly, the inlet connection portion and the outlet connection portion include the bellows portions and thus are improved in flexibility. Accordingly, a degree of displacement absorption increases. Vibration absorption performance is also improved.

(7) The power converter according to any one of (1) to (6), wherein the refrigerant pipe portion includes: a compression portion (for example, a compression portion 431 to be described later) that is compressed in a stacking direction; and a deformation portion (for example, a deformation portion 432 to be described later) that is deformed in the stacking direction due to the compression.

According to the power converter described in (7), in the power converter according to any one of (1) to (6), particularly, since the deformation portion is deformed by a compression load, a degree of displacement absorption increases and an effect of reducing unevenness in contact pressure on the contact surface portion is improved.

(8) The power converter according to (7), wherein the deformation portion includes a recessed portion (for example, a recessed portion 432a to be described later).

According to the power converter described in (8), in the power converter according to (7), particularly, by concentrating a load on the recessed portion to deform the recessed portion and thus preventing the deformation from spreading to another portion, a holding force of the compression portion on the semiconductor chip or the semiconductor module increases. Since the deformation portion can be formed by simply forming a recessed shape, it is possible to achieve easy manufacturing and a decrease in cost.

(9) The power converter according to (7) or (8), wherein the deformation portion is disposed at a position separated from the semiconductor chip or the semiconductor module.

According to the power converter described in (9), in the power converter according to (7) or (8), particularly, since a strength difference occurs between the deformation portion and the other portions, the deformation portion can be easily deformed. Accordingly, the holding force of the compression portion on the semiconductor chip or the semiconductor module increases.

(10) The power converter according to any one of (7) to (9), wherein the refrigerant pipe portion includes a cooling fin (for example, a cooling fin 440 to be described later) therein, and the deformation portion is disposed at a position separated from the cooling fin.

According to the power converter described in (10), in the power converter according to any one of (7) to (9), particularly, since a strength difference occurs between the vicinity of the cooling fin and the deformation portion, the deformation portion can be easily deformed. Accordingly, the holding force of the compression portion on the semiconductor chip or the semiconductor module increases.

(11) The power converter according to any one of (7) to (10), wherein the deformation portion has a ring shape that surrounds the semiconductor chip or the semiconductor module.

According to the power converter described in (11), in the power converter according to any one of (7) to (10), particularly, it is possible to cope with even a case in which a stress concentration direction is not fixed due to unevenness in dimensions or the like of the constituent portions. Accordingly, the holding force of the compression portion on the semiconductor chip or the semiconductor module increases.

Effects of the Invention

According to the invention, it is possible to provide a power converter that has a sufficient degree of absorption of unevenness in dimensions of constituent portions and the like, has high vibration absorption performance, and can prevent fatigue fracture.

DESCRIPTION OF THE EMBODIMENTS

Hereinafter, the invention will be disclosed by describing a power converter according to an embodiment of the invention with reference to the accompanying drawings.

First, a power converter according to an embodiment of the invention will be described in detail with reference to FIGS. 1 to 4.

Figure 1:
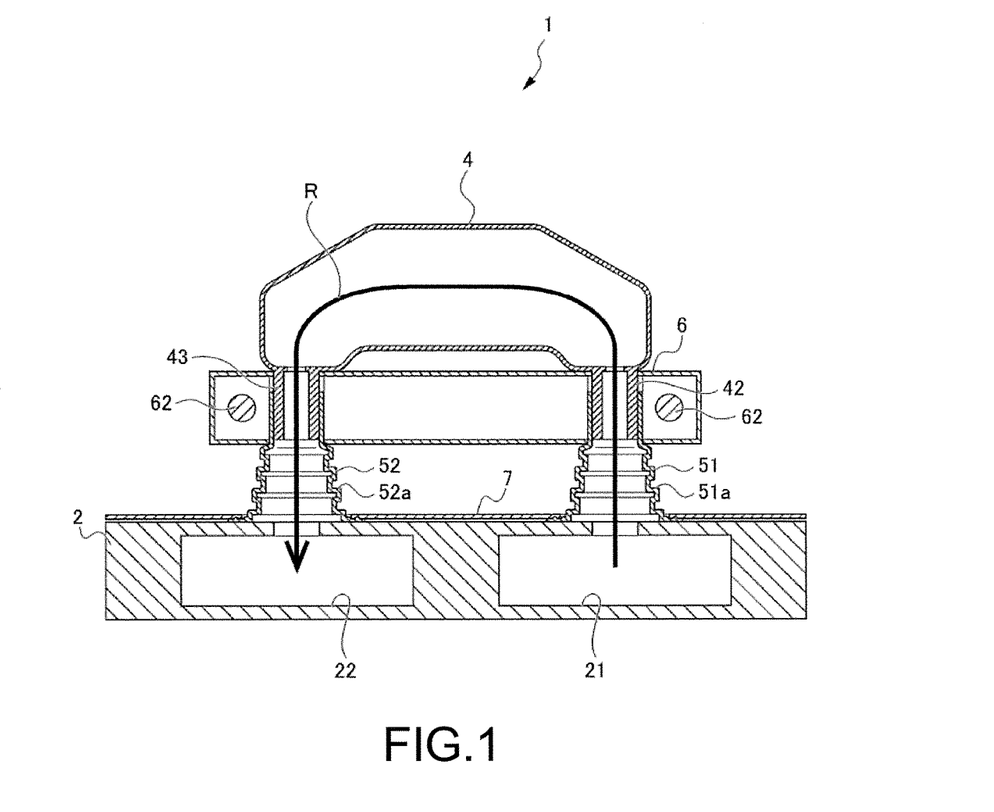
FIG. 1 is a partial cross-sectional view illustrating a power converter according to an embodiment of the invention.
Figure 2:
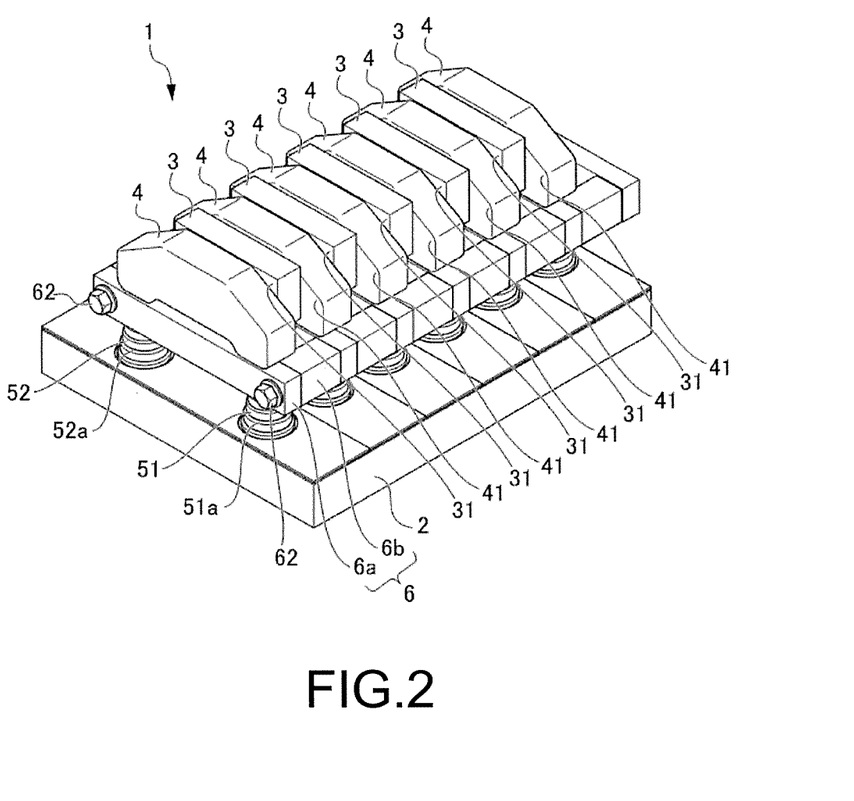
FIG. 2 is a perspective view illustrating the power converter according to the embodiment of the invention.
Figure 3:
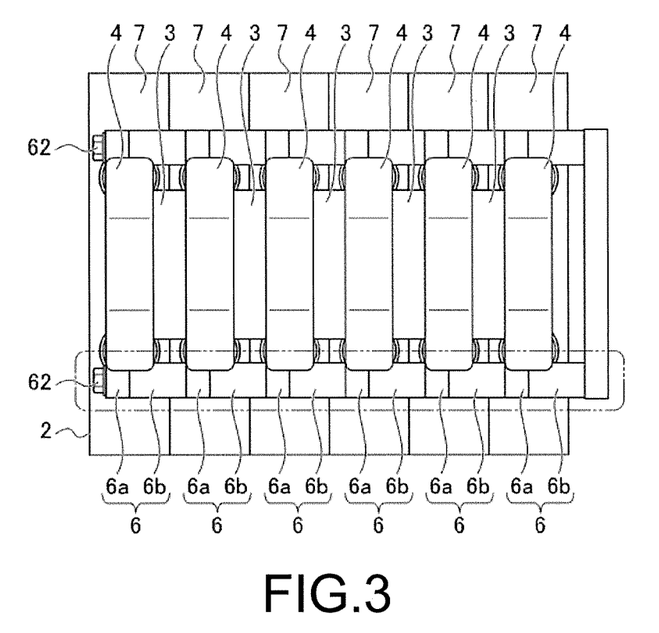
FIG. 3 is a plan view of the power converter illustrated in FIG. 2.
Figure 4:
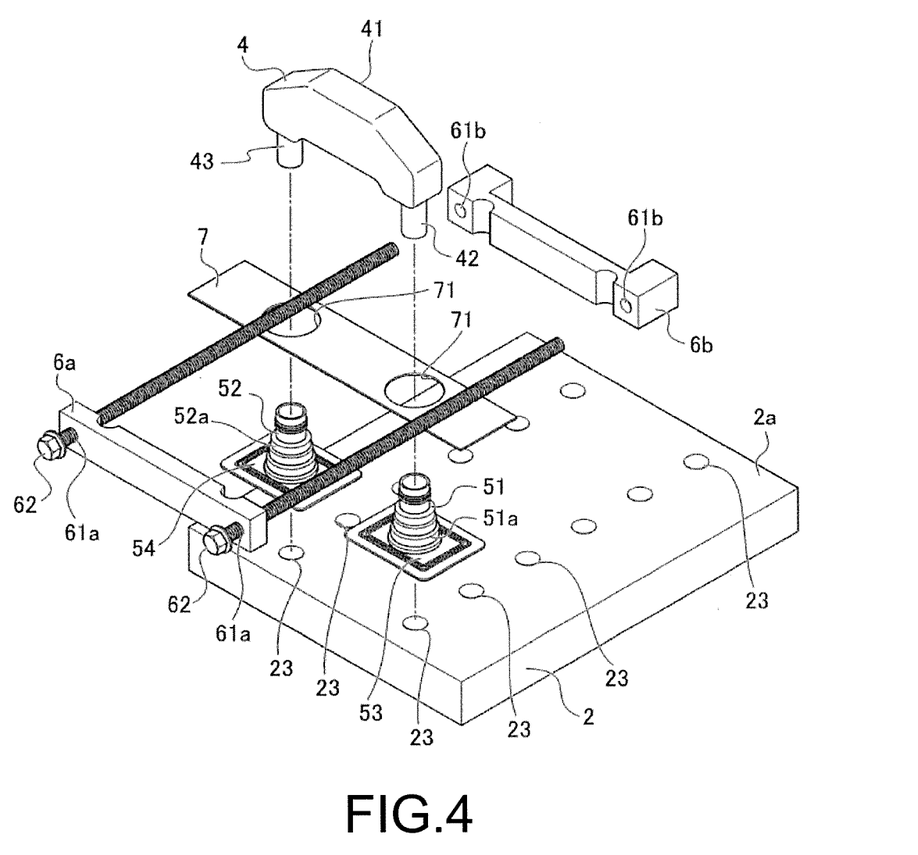
FIG. 4 is a partial exploded perspective view of the power converter illustrated in FIG. 2.

FIGS. 1 to 4 are diagrams illustrating a power converter according to an embodiment of the invention, where FIG. 1 is a partial cross-sectional view of the power converter, FIG. 2 is a perspective view of the power converter, FIG. 3 is a plan view of the power converter, and FIG. 4 is a partial exploded perspective view of the power converter.

The power converter 1 according to the embodiment of the invention includes an electronic device that constitutes a part of a power conversion circuit and a refrigerant flow channel member 2 in which a refrigerant for cooling the electronic device flows. As can be easily understood with reference to FIG. 1, the refrigerant flow channel member 2 includes a supply-side refrigerant flow channel 21 and a recovery-side refrigerant flow channel 22 which are flow channels in which the refrigerant for cooling the electronic device flows.

The power conversion circuit is configured, for example, to serve as a converter or to serve as a combination of a converter and an inverter.

The electronic device includes a power module 3 including a semiconductor chip or a semiconductor module as a main component. The power module 3 may be configured to actually constitute the electronic device as a whole or may be configured to constitute a part thereof.

As can be apparently seen from FIGS. 2 and 3, a plurality of power modules 3 are disposed to be interposed between a plurality of flat refrigerant pipe portions 4 which are arranged in parallel.

That is, the refrigerant pipe portions 4 and the power modules 3 are alternately stacked. Each of the refrigerant pipe portions 4 includes a contact surface portion 41 in which a refrigerant for cooling the power module 3 flows and which can come into contact with a principal surface 31 of the power module 3 to exchange heat.

An inlet pipe portion 42 through which a refrigerant flows into the refrigerant pipe portion 4 is disposed at one end of each refrigerant pipe portion 4. An outlet pipe portion 43 through which the refrigerant flows from the refrigerant pipe portion 4 is disposed at the other end of each refrigerant pipe portion 4.

An inlet connection portion 51 that connects the inlet pipe portion 42 to the refrigerant flow channel member 2 (the supply-side refrigerant flow channel 21) is provided. The inlet connection portion 51 is formed of a tubular elastic member.

Similarly, an outlet connection portion 52 that connects the outlet pipe portion 43 to the refrigerant flow channel member 2 (the recovery-side refrigerant flow channel 22) is provided. The outlet connection portion 52 is formed of a tubular elastic member.

As can be apparently seen from FIGS. 1 to 4, the inlet connection portion 51 and the outlet connection portion 52 include bellows portions 51a and 52a formed in a bellows shape.

As indicated by an arrow R in FIG. 1, the refrigerant flows in a path of the supply-side refrigerant flow channel 21→the inlet connection portion 51→the inlet pipe portion 42→the refrigerant pipe portion 4→the outlet pipe portion 43→the outlet connection portion 52→the recovery-side refrigerant flow channel 22 for each refrigerant pipe portion 4. Accordingly, the circulating refrigerant exchanges heat with the power module 3 of which a principal surface 31 comes into contact with the contact surface portion 41 of the refrigerant pipe portion 4 to prevent the power module 3 from being overheated.

In this embodiment, as illustrated in FIG. 1, a part of the inlet pipe portion 42 on the refrigerant flow channel member 2 side is inserted into the inlet connection portion 51. Similarly, a part of the outlet pipe portion 43 on the refrigerant flow channel member 2 side is inserted into the outlet connection portion 52.

As described above, the part of the inlet pipe portion 42 inserted into the inlet connection portion 51 and the part of the outlet pipe portion 43 inserted into the outlet connection portion 52 are provided with a first fixing member 6 that clamps the parts from the outer circumference sides thereof.

That is, the first fixing member 6 clamps the inlet connection portion 51 in cooperation with the inlet pipe portion 42 and clamps the outlet connection portion 52 in cooperation with the outlet pipe portion 43.

In this embodiment, as can be easily understood with reference to FIGS. 1 and 4, the first fixing member 6 is divided into two members having a fastening hole, and the two members 6a and 6b are fastened and fixed with bolts 62 which are fastening members fitted into fastening holes 61a and 61b such that the inlet pipe portion 42 and the outlet pipe portion 43 are interposed therebetween form the outer circumference sides of the inlet connection portion 51 and the outlet connection portion 52. In this embodiment, particularly, as illustrated in FIGS. 2 and 3, the bolt 62 is a long penetration bolt and a plurality of neighboring first fixing members 6 (6a and 6b) are integrally fastened and fixed with the bolts 62.

As can be apparently seen from a part surrounded with a two-dot chained line in FIG. 3, a plurality of first fixing members 6 (6a and 6b) are integrally fastened and fixed with the long penetration bolts 62 such that the first fixing members are aligned in the length direction of the bolts 62 without causing unevenness in the other directions.

As can be easily understood with reference to FIG. 4, the refrigerant flow channel member 2 includes a plurality of holes 23 and 23 formed in a surface 2a thereof. The inlet connection portion 51 and the outlet connection portion 52 include flange portions 53 and 54 which are disposed to cover the corresponding holes 23 and 23, respectively. A second fixing member 7 that clamps the flange portions 53 and 54 in cooperation with the surface 2a of the refrigerant flow channel member 2 is provided. The second fixing member 7 includes openings 71 and 71 which are formed at positions corresponding to the inlet connection portion 51 and the outlet connection portion 52, and clamps the flange portions 53 and 54 to surface-press the flange portions to the surface 2a using the peripheries of the openings 71 and 71.

As indicated by one-dot chained lines in the vertical direction in FIG. 4, an axis of the inlet pipe portion 42, an axis of the inlet connection portion 51, and the center of the hole 23 corresponding to the inlet pipe portion 42 and the inlet connection portion 51 are positioned to correspond to each other, and the flange portion 53 is clamped and fixed on the surface 2a of the refrigerant flow channel member 2 by the second fixing member 7.

Similarly, an axis of the outlet pipe portion 43, an axis of the outlet connection portion 52, and the center of the hole 23 corresponding to the outlet pipe portion 43 and the outlet connection portion 52 are positioned to correspond to each other, and the flange portion 54 is clamped and fixed on the surface 2a of the refrigerant flow channel member 2 by the second fixing member 7.

As the parts of the flange portions 53 and 54 of the inlet connection portion 51 and the outlet connection portion 52 which are elastic members which are clamped and fixed on the surface 2a of the refrigerant flow channel member 2 by the second fixing member 7, corresponding parts of the inlet connection portion 51 and the outlet connection portion 52 serving as a grommet or the whole thereof perform a sealing function on a flowing refrigerant to prevent leakage of the refrigerant (water leakage) as described above.

In the embodiment illustrated in FIGS. 1 to 4, bonding of the second fixing member 7 onto the surface 2a of the refrigerant flow channel member 2 can employ methods such as friction stir welding, welding, and ultrasonic bonding. In any case, the number of bolts can be reduced by integrally fastening a plurality of first fixing members 6 (6a and 6b) of pairs using the long penetration bolts 62 as described above.

Operational advantages of the power converter according to the embodiment of the invention which have been described above with reference to FIGS. 1 to 4 will be described below.

In the power converter 1 which has been described with reference to FIGS. 1 to 4, an electronic device including a power module 3 and constituting a part of a power conversion circuit is cooled by a refrigerant which flows between the supply-side refrigerant flow channel 21 and the recovery-side refrigerant flow channel 22 in the refrigerant flow channel member 2. Particularly, a plurality of refrigerant pipe portions 4 are arranged to cool the power module 3. That is, the refrigerant pipe portions 4 are alternately stacked along with a plurality of power modules 3 to come into contact with the principal surfaces of the power modules 3 and has a flat shape including a contact surface portion 41 which can exchange heat with the principal surface, and the plurality of refrigerant pipe portions 4 are arranged in parallel. The power modules 3 are cooled to prevent overheating by exchange of heat with the refrigerant pipe portions 4. As conceptually indicated by an arrow R in FIG. 1, the flow of the refrigerant in each refrigerant pipe portion 4 circulates to enter the refrigerant pipe portion 4 via the inlet pipe portion 42 from the supply-side refrigerant flow channel 21 of the refrigerant flow channel member 2 and to return to the recovery-side refrigerant flow channel 22 of the refrigerant flow channel member 2 via the outlet pipe portion 43.

As described above, the inlet pipe portion 42 of the refrigerant pipe portion 4 is connected to the refrigerant flow channel member 2 (the supply-side refrigerant flow channel 21 thereof) via the inlet connection portion 51, and similarly, the outlet pipe portion 43 is connected to the refrigerant flow channel member 2 (the recovery-side refrigerant flow channel 22 thereof) via the outlet connection portion 52.

In this case, particularly, the inlet connection portion 51 and the outlet connection portion 52 are formed of a tubular elastic member.

Accordingly, the tolerance for unevenness in dimensions or the like of the constituent portions increases. Since the inlet pipe portion and the outlet pipe portion are connected to the refrigerant flow channel member 2 via the elastic members, vibration absorption performance is high. Accordingly, it is possible to prevent fatigue fracture even when the thickness of the refrigerant pipe portion is small.

In the refrigerant pipe portion 4, a part of the inlet pipe portion 42 is inserted into the inlet connection portion 51, a part of the outlet pipe portion 43 is inserted into the outlet connection portion 52, and the first fixing member 6 that clamps the inserted parts from the outer circumference side is provided. At this time, the first fixing member 6 clamps the inlet connection portion 51 in cooperation with the inlet pipe portion 42 and clamps the outlet connection portion 52 in cooperation with the outlet pipe portion 43.

By employing the configuration including the above-mentioned first fixing member 6, it is possible to prevent leakage of a refrigerant (water leakage) with a relatively simple configuration having a small number of components.

The first fixing member 6 includes two members 6a and 6b each having a fastening hole, and the two members 6a and 6b are fastened and fixed to each other by holts 62 which are fastening members fitted into the fastening holes 61a and 61b such that the inlet pipe portion 42 and the outlet pipe portion 43 are interposed from the outer circumference sides of the inlet connection portion 51 and the outlet connection portion 52.

Accordingly, the inlet pipe portion 42 and the outlet pipe portion 43 can be easily clamped by a fastening force of the bolts 62 which are the fastening members.

Regarding the first fixing member 6, a plurality of neighboring first fixing members (6a and 6b) are integrally fastened and fixed by the bolts 62 which are the fastening members.

Accordingly, it is possible to reduce the number of components and the number of assembling operation processes.

On the other hand, the refrigerant flow channel member 2 includes the holes 23 formed in the surface 2a thereof, the inlet connection portion 51 and the outlet connection portion 52 include the flange portions 53 disposed to cover the holes 23, and the second fixing member 7 that clamps the flange portions 53 in cooperation with the surface 2a of the refrigerant flow channel member 2 is further provided.

Accordingly, it is possible to prevent leakage of a refrigerant (water leakage) with a simple structure.

As described above with reference to FIGS. 1 and 4, the inlet connection portion 51 and the outlet connection portion 52 include the bellows portions 51a and 52a which are formed in a bellows shape.

Accordingly, the inlet connection portion 51 and the outlet connection portion 52 have flexibility based on the bellows portions. As a result, the inlet connection portion 51 and the outlet connection portion 52 have a great degree of absorption of displacement. The vibration absorption performance is improved.

A power converter according to another embodiment of the invention will be described below with reference to FIGS. 5 and 6.

Figure 5:
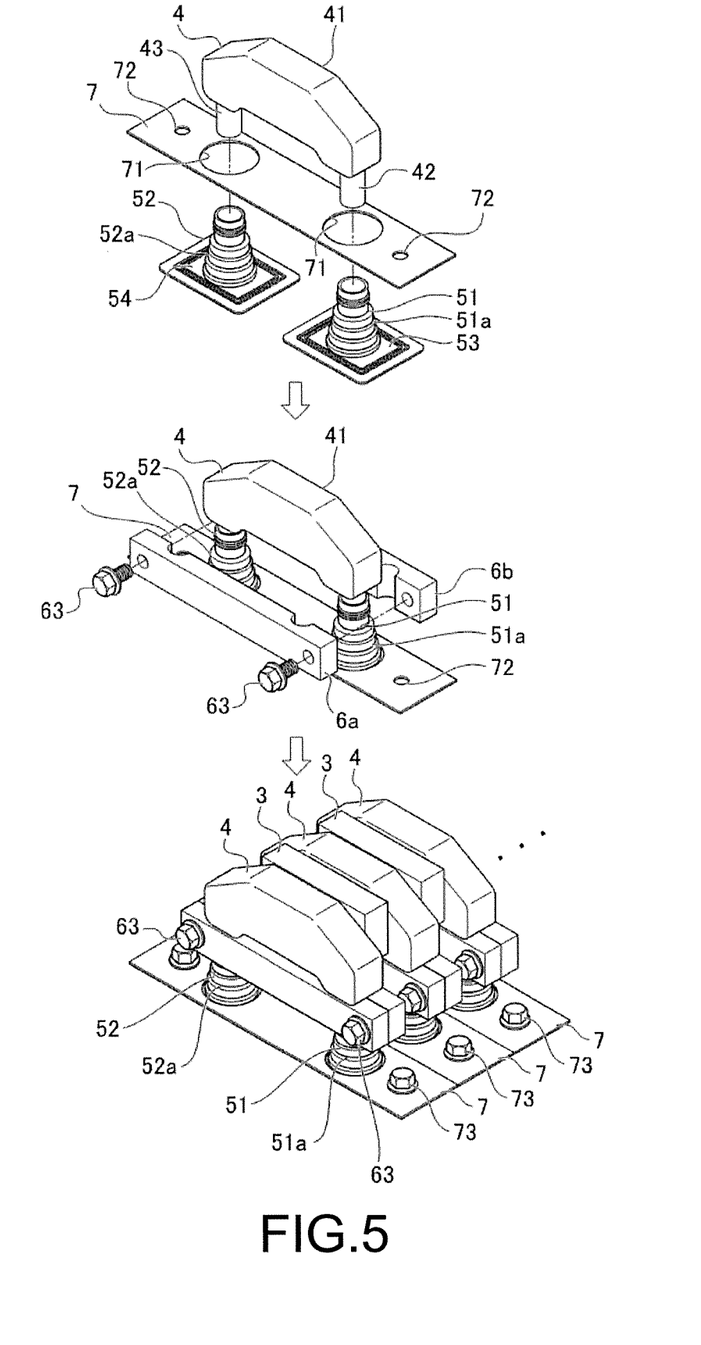
FIG. 5 is an assembling perspective view illustrating a power converter according to another embodiment of the invention.

FIG. 5 is an assembling perspective view illustrating a power converter according to another embodiment of the invention.

Figure 6:
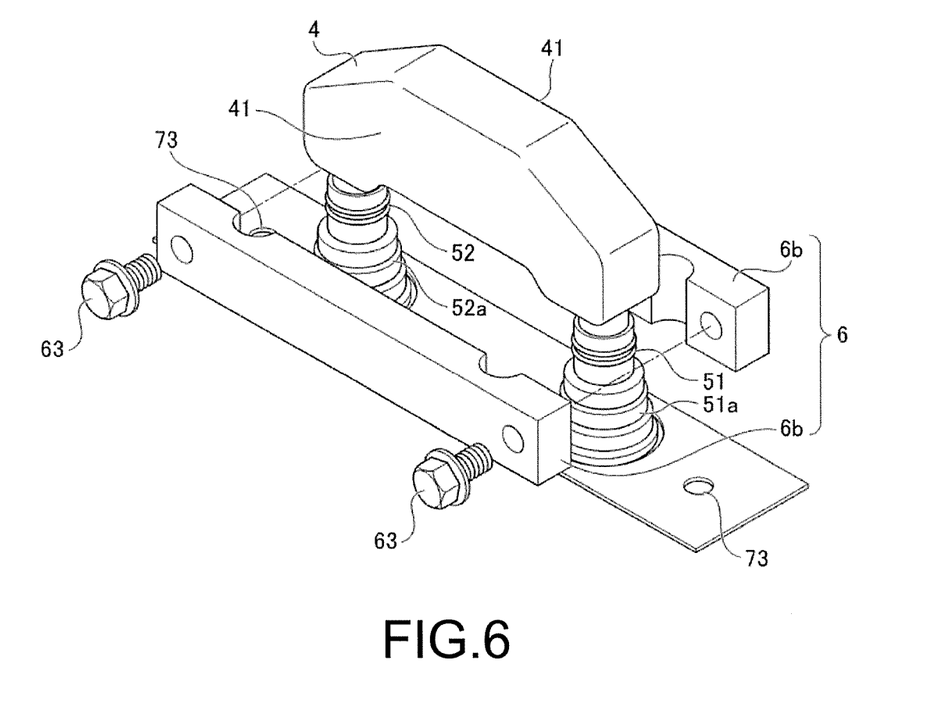
FIG. 6 is a partial enlarged perspective view of the power converter illustrated in FIG. 5.

FIG. 6 is a partial enlarged perspective view of the power converter illustrated in FIG. 5.

In FIGS. 5 and 6, the same portions as described above with reference to FIGS. 1 to 4 will be referenced by the same reference signs and description thereof will not be repeated.

A difference between the embodiment illustrated in FIGS. 5 and 6 and the embodiment described above with reference to FIGS. 1 to 4 is as follows. That is, in FIGS. 1 to 4, a plurality of first fixing members 6 (6a and 6b) are integrally fastened and fixed with the long penetration bolts 62 such that the first fixing members are aligned in the length direction of the bolts 62 without causing unevenness in the other directions.

On the other hand, in the embodiment illustrated in FIGS. 5 and 6, for each pair of first fixing members 6*a* and 6*b*, each pair of first fixing members (6*a* and 6*b*) is fastened and fixed with bolts 63 which are not as long as the long penetration bolts 62.

In the embodiment illustrated in FIGS. 5 and 6, bonding of the second fixing member 7 onto the surface 2*a* of the refrigerant flow channel member 2 is performed using bolts 73 being fastened into bolt holes 72 formed in the second fixing member 7.

In the embodiment described above with reference to FIGS. 5 and 6, in the first fixing member 6, each pair of first fixing members (6*a* and 6*b*) is fastened with the bolts 63 instead of integrally fastening and fixing a plurality of neighboring first fixing members (6*a* and 6*b* with the bolts 62 which are fastening members, and bolt fastening using the bolts 73 is used to bond the second fixing members 7 to the surface 2*a* of the refrigerant flow channel member 2.

Accordingly, the effects of reducing the number of components and reducing the number of assembling operation processes do not reach those of the embodiment described above with reference to FIGS. 1 to 4, but the same operational advantages are achieved in the other regards. Since the long penetration bolts 62 do not need to be prepared, simplification of component management can be achieved by using the bolts having the same specifications.

A power converter according to another embodiment of the invention will be described below with reference to FIGS. 7 to 9.

Figure 7:
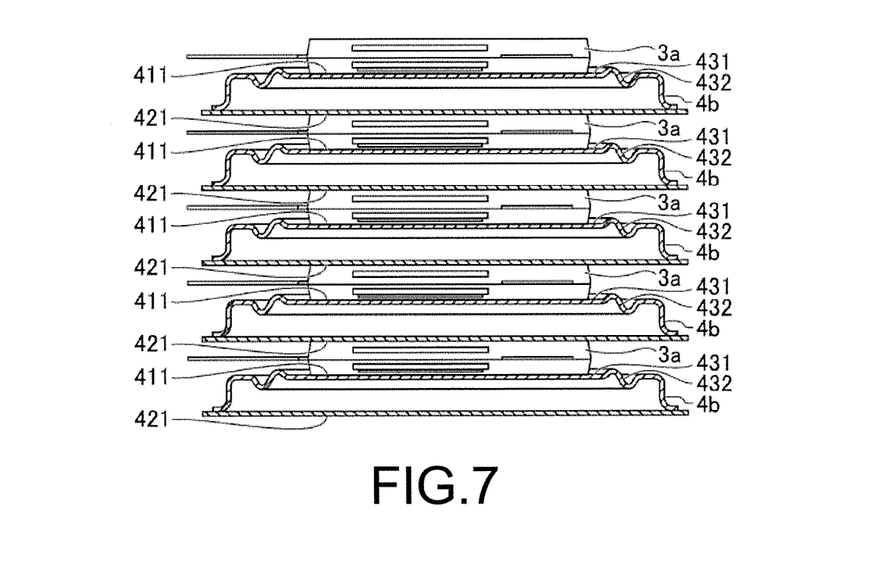
FIG. 7 is a diagram schematically illustrating a configuration of a power converter according to another embodiment of the invention.

FIG. 7 is a diagram schematically illustrating a configuration of a power converter according to another embodiment of the invention.

Figure 8:
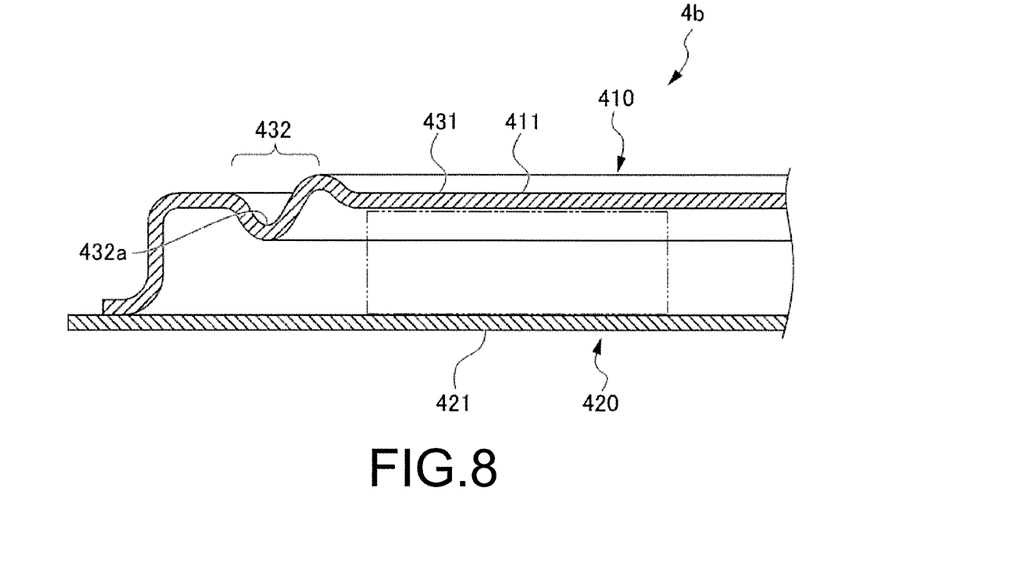
FIG. 8 is a partial enlarged view of the power converter illustrated in FIG. 7.

FIG. 8 is a partial enlarged view of the power converter illustrated in FIG. 7.

Figure 9:
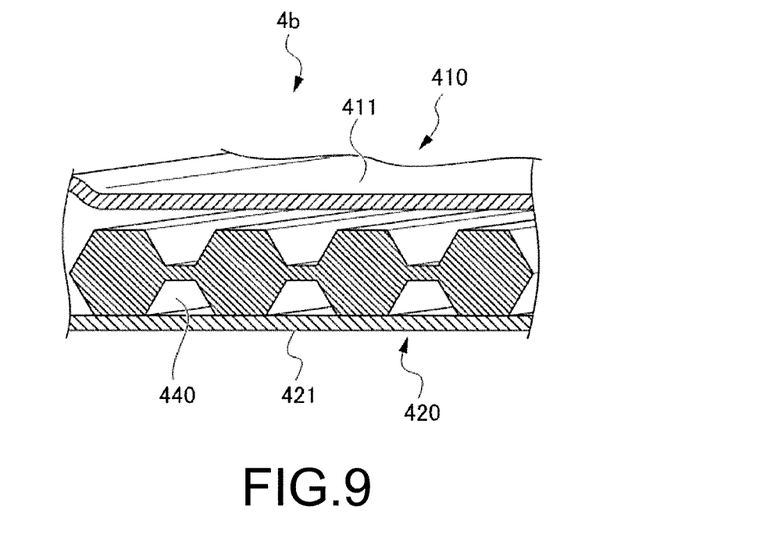
FIG. 9 is a diagram illustrating the inside of a refrigerant pipe portion of the power converter illustrated in FIG. 8.

FIG. 9 is a diagram illustrating the inside of a refrigerant pipe portion of the power converter illustrated in FIG. 8.

In FIGS. 7 to 9, the same portions are referenced by the same reference signs, a plurality of power modules 3*a* correspond to the above-mentioned power module 3, and a refrigerant pipe portion 4*b* corresponds to the above-mentioned refrigerant pipe portion 4.

As can be easily understood with reference to FIG. 7, in this embodiment, the refrigerant pipe portions 4*b* and the power modules 3*a* are alternately stacked such that the power modules 3*a* are interposed between a plurality of refrigerant pipe portions 4*b* which are arranged in parallel.

Although not illustrated in FIG. 7, the same inlet pipe portion and outlet pipe portion as the inlet pipe portion 42 and outlet pipe portion 43 which have been described above with reference to FIG. 1 are disposed in each of the plurality of refrigerant pipe portions 4*b*. The configuration in which the inlet pipe portions and the outlet pipe portions are connected to the refrigerant flow channel member 2 by an inlet connection portion and an outlet connection portion which are elastic members are the same as the configuration described above for connection to the refrigerant flow channel member.

A difference between the embodiment illustrated in FIGS. 7 to 9 and the embodiment illustrated in FIGS. 1 to 4 is the configuration of the refrigerant pipe portion 4*b*.

That is, the refrigerant pipe portion 4*b* is used by applying an external force in the stacking direction (a pressure in the stacking direction) in the illustrated stacked structure using appropriate means (not illustrated) such as fastening for the purpose of efficient heat exchange between the principal surface of the power module 3*a* and the contact surface portion of the refrigerant pipe portion 4*b*.

In the refrigerant pipe portion 4*b* of the embodiment illustrated in FIGS. 7 to 9, a structure in which the refrigerant pipe portion 4*b* is partially deformed and evenness of a contact pressure in an in-plane direction can be maintained when a pressure in the stacking direction increases is employed.

The refrigerant pipe portion 4*b* includes a first principal surface plate 410 in which a first contact surface portion 411 coming into contact with one principal surface (a lower principal surface in FIG. 7) of the power module 3*a* is set and a second principal surface plate 420 in which a second contact surface portion 421 coming into contact with the other principal surface (an upper principal surface in FIG. 7) of the power module 3*a* is set.

The second principal surface plate 420 has a flat plate shape as a whole. The circumferential edge portion of the first principal surface plate 410 which is substantially parallel to the second principal surface plate 420 is folded to get close to the circumferential edge portion of the second principal surface plate 420 to form a vessel shape. The first principal surface plate 410 and the second principal surface plate 420 are bonded to each other in the vicinity of the circumferential edge portions thereof.

As illustrated in the partial enlarge view of FIG. 8, the first contact surface portion 411 of the first principal surface plate 410 constitutes a compression portion 431 that receives a pressure for clamping a stacked body in which the refrigerant pipe portions 4*b* and the power modules 3*a* are stacked in the stacking direction when the pressure is applied to the stacked body. A deformation portion 432 that is relatively easily deformed by the pressure for clamping the stacked body in the stacking direction is formed in the vicinity of the outer circumference of the compression portion 431.

In the deformation portion 432 in this embodiment, a recessed portion 432*a* in which the first principal surface plate 410 protrudes a little in a direction in which the first principal surface plate is spaced apart from the second principal surface plate 420 as the first principal surface plate is spaced apart from the center thereof (to the right side in FIG. 8) and then is recessed in a direction in which the first principal surface plate gets close to the second principal surface plate 420 as the first principal surface plate is spaced from the center is formed.

That is, the deformation portion 432 of the first principal surface plate 410 in the refrigerant pipe portion 4*b* of this embodiment has a ring shape which is spaced apart from the first contact surface portion 411 in the first principal surface plate 410 and surrounds the first contact surface portion 411 so as not to overlap the first contact surface portion 411.

In other words, the deformation portion 432 has a ring shape has a ring shape which is spaced apart from the position of the power module 3*a* and surrounds the position so as not to overlap the position of the power module 3*a*.

In FIG. 8, a cooling fin 440 illustrated in FIG. 9 is disposed in an area indicated by a two-dot chained line in the refrigerant pipe portion 4*b*. As illustrated in the drawing, the deformation portion 432 is spaced apart from a position at which the cooling fin 440 is disposed so as not to overlap the position.

The cooling fin 440 increases a contact area (a heat transfer area) with a refrigerant flowing in the refrigerant pipe portion 4b to enhance heat exchange efficiency, to achieve a decrease in size, and to improve cooling ability for the power module 3a.

According to the embodiment described above with reference to FIGS. 7 to 9, since the deformation portion 432 formed in the first principal surface plate 410 of the refrigerant pipe portion 4b is deformed by a compression load earlier than the other portion, a degree of displacement absorption increases and an effect of reducing unevenness in contact pressure on the first contact surface portion 411 is improved.

The deformation portion 432 includes the recessed portion 432a, and by concentrating a load on the recessed portion 432a to deform the recessed portion and thus preventing the deformation from spreading to another portion, a holding force of the compression portion 431 on the power module 3a increases. Since the deformation portion can be formed by simply forming a recessed shape, it is possible to achieve easy manufacturing and a decrease in cost.

The deformation portion 432 is spaced apart from the position of the power module 3a so as not to overlap the position. Accordingly, since a strength difference occurs between the deformation portion 432 and the other portion, the deformation portion 432 can be easily deformed. Accordingly, the holding force of the compression portion 431 on the power module 3a increases.

Since the deformation portion 432 is spaced apart from the position at which the cooling fin 440 is disposed so as not to overlap the position and a strength difference occurs between a portion in the vicinity of the cooling fin 440 and the deformation portion 432, the deformation portion 432 can be easily deformed. Accordingly, the holding force of the compression portion 431 on the power module 3a increases.

Since the deformation portion 432 has a ring shape surrounding the power module 3a, it is possible to cope with even a case in which a stress concentration direction is not fixed due to unevenness in dimensions or the like of the constituent portions. Accordingly, the holding force of the compression portion 431 on the power module 3a increases.

Operational advantages of the power converter according to the above-mentioned embodiment will be summarized below.

(1) The flat refrigerant pipe portions 4 including the contact surface portion 41 which can come into contact with the principal surfaces of the power modules 3 to exchange heat along with the power modules 3 are alternately stacked to form a stacked body. A refrigerant from the refrigerant flow channel member 2 circulates in each refrigerant pipe portion 4. The refrigerant flow channel member 2 includes the supply-side refrigerant flow channel 21 and the recovery-side refrigerant flow channel 22. The circulation of a refrigerant is carried out such that the refrigerant supplied from the supply-side refrigerant flow channel 21 of the refrigerant flow channel member 2 to the inlet pipe portion 42 of each refrigerant pipe portion 4 flows in the refrigerant pipe portion 4 and returns from the outlet pipe portion 43 to the recovery-side refrigerant flow channel 22 of the refrigerant flow channel member 2. The inlet pipe portion 42 of the refrigerant pipe portion 4 is connected to the refrigerant flow channel member 2 via the inlet connection portion 51, and the outlet pipe portion 43 is connected to the refrigerant flow channel member 2 via the outlet connection portion 52. The inlet connection portion 51 and the outlet connection portion 52 are formed of a tubular elastic member.

Accordingly, the tolerance for unevenness in dimensions or the like of the constituent portions increases. Since the inlet pipe portion and the outlet pipe portion are connected to the refrigerant flow channel member via the elastic members, vibration absorption performance is high. Accordingly, it is possible to prevent fatigue fracture even when the thickness of the refrigerant pipe portion is small.

(2) Since a part of the inlet pipe portion 42 on the refrigerant flow channel member 2 side is inserted into the inlet connection portion 51, a part of the outlet pipe portion 43 on the refrigerant flow channel member 2 side is inserted into the outlet connection portion 52, and the power converter includes the first fixing member 6 (6a and 6b) that clamps the inlet connection portion 51 in cooperation with the inlet pipe portion 42 and clamps the outlet connection portion 52 in cooperation with the outlet pipe portion 43, it is possible to prevent leakage of a refrigerant (water leakage) with a simple configuration.

(3) The first fixing member 6 includes two members 6a and 6b each having the fastening hole, and the two members 6a and 6b are fastened and fixed to each other at the fastening holes by the bolts 62 such that the inlet pipe portion 42 and the outlet pipe portion 43 are interposed therebetween.

Accordingly, it is possible to easily clamp the inlet pipe portion 42 and the outlet pipe portion 43 with a fastening force based on the bolts 62.

(4) Since a plurality of neighboring first fixing members 6 (6a and 6b) of which each is the same as the first fixing member 6 are integrally fastened and fixed by the bolts 62, it is possible to reduce the number of components or to reduce the number of assembling operation processes.

(5) Since the refrigerant flow channel member 2 includes the holes 23 formed on the surface 2a thereof, the inlet connection portion 51 and the outlet connection portion 52 include the flange portion 53 disposed to cover the holes 23, and the power converter further includes the second fixing member 7 that clamps the flange portions 53 in cooperation with the surface 2a of the refrigerant flow channel member 2, it is possible to prevent leakage of a refrigerant (water leakage) with a simple structure.

(6) Since the inlet connection portion 51 and the outlet connection portion 52 include the bellows portions 51a and 52a that are formed in a bellows shape, a degree of displacement absorption is increased by the bellows portions having good flexibility. Vibration absorption performance is also improved.

(7) Since the refrigerant pipe portion 4 includes the compression portion 431 that is compressed in the stacking direction of the stacked body in which the power modules 3 and the refrigerant pipe portions 4 are alternately stacked and the deformation portion 432 that is deformed in the stacking direction due to the compression, the deformation portion 432 is deformed by a compression load to increase a degree of displacement absorption and the effect of reducing unevenness in contact pressure on the contact surface portion 41 is improved.

(8) Since the deformation portion 432 includes the recessed portion 432a, a holding force of the compression portion 431 on the power module 3 increases by concentrating a load on the recessed portion 432a to deform the recessed portion and thus preventing the deformation from spreading to the other portion. Since the deformation portion can be formed by simply forming a recessed shape, it is possible to achieve easy manufacturing and a decrease in cost.

(9) Since the deformation portion 432 is disposed at a position separated from the power module 3, a strength difference occurs between the deformation portion 432 and the other portion and thus the deformation portion 432 can be easily deformed. Accordingly, the holding force of the compression portion 431 on the power module 3 increases.

(10) Since the refrigerant pipe portion 4 includes the cooling fin 440 therein and the deformation portion 432 is disposed at a position separated from the cooling fin 440, a strength difference occurs between the vicinity of the cooling fin 440 and the deformation portion 432 and thus the deformation portion 432 can be easily deformed. Accordingly, the holding force of the compression portion 431 on the power module 3 increases.

(11) Since the deformation portion 432 has a ring shape that surrounds the power module 3, it is possible to cope with even a case in which a stress concentration direction is not fixed due to unevenness in dimensions or the like of the constituent portions. Accordingly, the holding force of the compression portion 431 on the power module 3 increases.

In addition to the above-mentioned embodiments, various modifications or alternatives without departing from the gist of the invention are included in the scope of the invention.

The power converter according to the invention has been described with reference to an example in which the inlet connection portion 51 and the outlet connection portion 52 are formed of a tubular elastic member, but the shape of the inlet connection portion 51 and the outlet connection portion 52 is not limited thereto. The technical concept of the invention can be effectively used even when an appearance thereof is a prismatic shape or the like.

What is claimed is:

1. A power converter comprising:
an electronic device that includes a semiconductor chip or a semiconductor module and constitutes a part of a predetermined power conversion circuit;
a refrigerant flow channel member in which a refrigerant for cooling the electronic device flows;
a flat refrigerant pipe portion that is alternately stacked along with the semiconductor chip or the semiconductor module, is provided for a refrigerant for cooling the semiconductor chip or the semiconductor module to flow therein, and includes a contact surface portion which comes into contact with a principal surface of the semiconductor chip or the semiconductor module to exchange heat;
an inlet pipe portion that is disposed at one end of the refrigerant pipe portion and through which the refrigerant flows to the refrigerant pipe portion;
an outlet pipe portion that is disposed at the other end of the refrigerant pipe portion and through which the refrigerant flows from the refrigerant pipe portion;
an inlet connection portion that connects the inlet pipe portion to the refrigerant flow channel member and is formed of a tubular elastic member; and
an outlet connection portion that connects the outlet pipe portion to the refrigerant flow channel member and is formed of a tubular elastic member,
wherein the inlet connection portion is directly connected to the inlet pipe portion, and the outlet connection portion is directly connected to the outlet pipe portion.

2. The power converter according to claim 1, wherein a part of the inlet pipe portion on the refrigerant flow channel member side is inserted into the inlet connection portion,
a part of the outlet pipe portion on the refrigerant flow channel member side is inserted into the outlet connection portion, and
the power converter further comprises a first fixing member that clamps the inlet connection portion in cooperation with the inlet pipe portion and clamps the outlet connection portion in cooperation with the outlet pipe portion.

3. The power converter according to claim 2, wherein the first fixing member includes two members each having a fastening hole, and
the two members are fastened and fixed to each other at the fastening holes by fastening members such that the inlet pipe portion and the outlet pipe portion are interposed therebetween.

4. The power converter according to claim 2, wherein the refrigerant flow channel member includes holes formed on a surface thereof,
the inlet connection portion and the outlet connection portion include flange portions disposed to cover the holes, and
the power converter further comprises a second fixing member that clamps the flange portion in cooperation with the surface of the refrigerant flow channel member.

5. The power converter according to claim 2, wherein the inlet connection portion and the outlet connection portion include bellows portions that are formed in bellows shapes.

6. The power converter according to claim 2, wherein the refrigerant pipe portion includes:
a compression portion that is compressed in a stacking direction; and
a deformation portion that is deformed in the stacking direction due to the compression.

7. The power converter according to claim 3, wherein a plurality of neighboring first fixing members of which each is the same as the first fixing member are integrally fastened and fixed by fastening members.

8. The power converter according to claim 3, wherein the refrigerant flow channel member includes holes formed on a surface thereof,
the inlet connection portion and the outlet connection portion include flange portions disposed to cover the holes, and
the power converter further comprises a second fixing member that clamps the flange portion in cooperation with the surface of the refrigerant flow channel member.

9. The power converter according to claim 3, wherein the inlet connection portion and the outlet connection portion include bellows portions that are formed in bellows shapes.

10. The power converter according to claim 3, wherein the refrigerant pipe portion includes:
a compression portion that is compressed in a stacking direction; and
a deformation portion that is deformed in the stacking direction due to the compression.

11. The power converter according to claim 7, wherein the refrigerant flow channel member includes holes formed on a surface thereof,
the inlet connection portion and the outlet connection portion include flange portions disposed to cover the holes, and
the power converter further comprises a second fixing member that clamps the flange portion in cooperation with the surface of the refrigerant flow channel member.

12. The power converter according to claim 7, wherein the inlet connection portion and the outlet connection portion include bellows portions that are formed in bellows shapes.

13. The power converter according to claim 1, wherein the refrigerant flow channel member includes holes formed on a surface thereof,
the inlet connection portion and the outlet connection portion include flange portions disposed to cover the holes, and
the power converter further comprises a fixing member that clamps the flange portion in cooperation with the surface of the refrigerant flow channel member.

14. The power converter according to claim 13, wherein the inlet connection portion and the outlet connection portion include bellows portions that are formed in bellows shapes.

15. The power converter according to claim 1, wherein the inlet connection portion and the outlet connection portion include bellows portions that are formed in bellows shapes.

16. The power converter according to claim 1, wherein the refrigerant pipe portion includes:

a compression portion that is compressed in a stacking direction; and
a deformation portion that is deformed in the stacking direction due to the compression.

17. The power converter according to claim 16, wherein the deformation portion includes a recessed portion.

18. The power converter according to claim 16, wherein the deformation portion is disposed at a position separated from the semiconductor chip or the semiconductor module.

19. The power converter according to claim 16, wherein the refrigerant pipe portion includes a cooling fin therein, and
the deformation portion is disposed at a position separated from the cooling fin.

20. The power converter according to claim 16, wherein the deformation portion has a ring shape that surrounds the semiconductor chip or the semiconductor module.

* * * * *